United States Patent
Xu

(10) Patent No.: US 10,868,282 B2
(45) Date of Patent: Dec. 15, 2020

(54) APPARATUS OF SEPARATING FLEXIBLE PANEL FROM GLASS SUBSTRATE AND METHOD THEREOF

(71) Applicant: Wuhan China Star Optoelectronics Technology Co., Ltd., Hubei (CN)

(72) Inventor: Huan Xu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 405 days.

(21) Appl. No.: 15/748,399

(22) PCT Filed: Oct. 19, 2017

(86) PCT No.: PCT/CN2017/106838
§ 371 (c)(1),
(2) Date: Jan. 29, 2018

(87) PCT Pub. No.: WO2019/056438
PCT Pub. Date: Mar. 28, 2019

(65) Prior Publication Data
US 2019/0386255 A1      Dec. 19, 2019

(30) Foreign Application Priority Data

Sep. 22, 2017   (CN) .......................... 2017 1 0864565

(51) Int. Cl.
*B32B 43/00*     (2006.01)
*H01L 51/56*     (2006.01)
*H01L 51/00*     (2006.01)

(52) U.S. Cl.
CPC ............ *H01L 51/56* (2013.01); *B32B 43/006* (2013.01); *H01L 51/0097* (2013.01);
(Continued)

(58) Field of Classification Search
CPC ............. B32B 43/006; Y10T 156/1132; Y10T 156/1168; Y10T 156/1944;
(Continued)

(56) References Cited

U.S. PATENT DOCUMENTS 6,227,276 B1 * 5/2001 Kim ................... B29C 63/0013
                                                              156/763
7,540,079 B2 * 6/2009 Okuyama .............. H05K 3/007
                                                              29/830

(Continued)

*Primary Examiner* — Mark A Osele
(74) *Attorney, Agent, or Firm* — Hemisphere Law, PLLC; Zhigang Ma

(57) ABSTRACT

An apparatus of separating a flexible panel from a glass substrate is provided. The apparatus includes a console, a movable object fixing table, a position catcher, a lifting platform, and a suction separator. The console respectively drives the movable object fixing table and the lifting platform to move to a first position and a second position according to a real-time position of a fixed object captured by the position catcher, and an adhesive element of the suction separator tightly attaches to the flexible panel of the fixed object, drives the lifting platform to move to a direction away from the movable object fixing table, and drives the movable object fixing table to move to a direction away from the suction separator to separate the flexible panel from the glass substrate of the fixed object and fix the flexible panel on the adhesive element.

13 Claims, 4 Drawing Sheets

(52) U.S. Cl.
CPC .......... *Y10S 156/924* (2013.01); *Y10S 156/93* (2013.01); *Y10S 156/941* (2013.01); *Y10T 156/1132* (2015.01); *Y10T 156/1168* (2015.01); *Y10T 156/1174* (2015.01); *Y10T 156/195* (2015.01); *Y10T 156/1944* (2015.01); *Y10T 156/1978* (2015.01)

(58) Field of Classification Search
CPC .......... Y10T 156/1978; Y10T 156/195; Y10T 156/1174; Y10S 156/93; Y10S 156/941; Y10S 156/924
See application file for complete search history.

(56) References Cited

U.S. PATENT DOCUMENTS

| | | | | |
|---|---|---|---|---|
| 7,849,900 B2* | 12/2010 | Miyamoto | .......... | B29C 63/0013 156/379.6 |
| 9,393,769 B2* | 7/2016 | Koo | .................... | B32B 43/006 |
| 9,475,270 B2* | 10/2016 | Xie | ...................... | B32B 43/006 |
| 10,236,446 B2* | 3/2019 | Yu | ........................ | H01L 51/003 |
| 2010/0303332 A1* | 12/2010 | Miki | ...................... | G07D 11/50 382/135 |

* cited by examiner

| driving a movable object fixing table to move in a first predetermined position range by a console, wherein the flexible panel and the glass substrate after a laser separating are as a fixed object fixed on the movable object fixing table | S1 |

| driving a lifting platform to move to a second position in the second predetermined position range and an adhesive element of a suction separator tightly attaches to the flexible panel of the fixed object fixed on the movable object fixing table by the console after a position catcher captured the fixed object on the movable object fixing table moved to a first position in the first predetermined position range | S2 |

| driving the lifting platform to move to a direction away from the movable object fixing table in the second predetermined position range, and driving the movable object fixing table to move to a direction away from the suction separator in the first predetermined position range to separate the flexible panel from the glass substrate of the fixed object fixed on the movable object fixing table and fix the flexible panel on the adhesive element; wherein a certain adhesive force of the adhesive element is larger than an adhesive force between the flexible panel and the glass substrate as the fixed object fixed on the movable object fixing table | S3 |

FIG. 9

APPARATUS OF SEPARATING FLEXIBLE PANEL FROM GLASS SUBSTRATE AND METHOD THEREOF

RELATED APPLICATIONS

The present application is a National Phase of International Application Number PCT/CN2017/106838, filed on Oct. 19, 2017, and claims the priority of China Application No. 201710864565.8, filed on Sep. 22, 2017.

FIELD OF THE DISCLOSURE

The disclosure relates to the technical field of liquid crystal display panel, and particularly to an apparatus and a method of separating flexible panel from glass substrate.

BACKGROUND

AMOLED (Active Matrix Organic Light-Emitting Diode) panel shows various advantages, such as high response speed, high contrast, ad wide view angle, as compared to a conventional liquid crystal panel. Therefore, AMOLED panel has wide development and application in the display panel industry.

In the application of AMOLED panel, the flexible panel is separated from the glass substrate by conventional laser separating. However, after separating, the opposite surface of the flexible panel and the glass substrate still has a certain adhesion, so the flexible panel and the glass substrate are not separated completely.

SUMMARY

The purpose of the disclosure is to overcome the disadvantage and the defect of the prior art. An apparatus and a method of separating flexible panel from glass substrate are provided, so the flexible panel could be completely separated from the glass substrate, and the flexible panel and the glass substrate will not be damaged.

To achieve the above object, according to one aspect, the embodiment of the disclosure provides an apparatus of separating a flexible panel from a glass substrate, the apparatus includes a console, a movable object fixing table, a position catcher, a lifting platform, and a suction separator, wherein the movable object fixing table is connected to a first end of the console, driven by the console to move back and forth in a first predetermined position range, a fixing position is disposed on the movable object fixing table, the flexible panel and the glass substrate after a laser separating are as a fixed object fixed on the fixing position and move back and forth in the first predetermined position range, and wherein a bottom of the glass substrate is fixed on the fixing position and the flexible panel is disposed on a top of the glass substrate, wherein the position catcher is connected to a second end of the console to capture a real-time position of the fixed object fixed on the movable object fixing table, wherein the lifting platform is connected to a third end of the console, driven by the console to move back and forth in a second predetermined position range, the suction separator is disposed on the lifting platform, and the lifting platform carries the suction separator to move back and forth in the second predetermined position range, wherein an adhesive element with a certain adhesive force is disposed on the suction separator to separate the flexible panel and the glass substrate as the fixed object fixed on the movable object fixing table, and the certain adhesive force is larger than an adhesive force between the flexible panel and the glass substrate as the fixed object fixed on the movable object fixing table, and wherein the console drives the movable object fixing table to move to a first position in the first predetermined position range according to the real-time position of the fixed object fixed on the movable object fixing table captured by the position catcher, drives the lifting platform to move to a second position in the second predetermined position range and the adhesive element tightly attaches to the flexible panel of the fixed object fixed on the movable object fixing table, drives the lifting platform to move to a direction away from the movable object fixing table in the second predetermined position range, and drives the movable object fixing table to move to a direction away from the suction separator in the first predetermined position range to separate the flexible panel from the glass substrate of the fixed object fixed on the movable object fixing table and fix the flexible panel on the adhesive element.

In one embodiment, the apparatus of separating a flexible panel from a glass substrate further includes a movable object stripping table connected to a fourth end of the console, driven by the console to move back and forth in a third predetermined position range, and a stripping element disposed on the movable object stripping table, wherein the console drives the movable object stripping table to move to a fourth position in the third predetermined position range when the console drives the lifting platform to move to a third position along the direction away from the movable object fixing table in the second predetermined position range, the stripping element tightly attaches the flexible panel adhered to the adhesive element of the suction separator, and the console drives the stripping element to move away from the direction away from the suction separator in the third predetermined position range to separate the flexible panel adhered on the adhesive element and fix the flexible panel on the stripping element, wherein an adhesive force of the stripping element is larger than the certain adhesive force of the adhesive element.

In one embodiment, the suction separator includes a roller with auto rotation, and an outer surface of the roller is covered by a layer of the adhesive element.

In one embodiment, the adhesive element includes an adhesive film with a certain adhesion.

In one embodiment, the stripping element comprises an adhesive glue with a certain adhesion.

In one embodiment, the position catcher includes a charge coupled device image sensor.

According to another aspect, the embodiment of the disclosure provides an apparatus of separating a flexible panel from a glass substrate. The apparatus of separating a flexible panel from a glass substrate includes a console, a movable object fixing table, a position catcher, a lifting platform, and a suction separator, wherein the movable object fixing table is connected to a first end of the console, driven by the console to move back and forth in a first predetermined position range, a fixing position is disposed on the movable object fixing table, the flexible panel and the glass substrate after a laser separating are as a fixed object fixed on the fixing position and move back and forth in the first predetermined position range, and wherein a bottom of the glass substrate is fixed on the fixing position and the flexible panel is disposed on a top of the glass substrate, wherein the position catcher is connected to a second end of the console to capture a real-time position of the fixed object fixed on the movable object fixing table, wherein the lifting platform is connected to a third end of the console, driven by the console to move back and forth in a second predetermined position range, the suction separator is disposed on the lifting platform, and the lifting platform carries the suction separator to move back and forth in the second predetermined position range, wherein an adhesive element with a certain adhesive force is disposed on the suction separator to separate the flexible panel and the glass substrate as the fixed object fixed on the movable object fixing table, and the certain adhesive force is larger than an adhesive force between the flexible panel and the glass substrate as the fixed object fixed on the movable object fixing table, wherein the console drives the movable object fixing table to move to a first position in the first predetermined position range according to the real-time position of the fixed object fixed on the movable object fixing table captured by the position catcher, drives the lifting platform to move to a second position in the second predetermined position range and the adhesive element tightly attaches to the flexible panel of the fixed object fixed on the movable object fixing table, drives the lifting platform to move to a direction away from the movable object fixing table in the second predetermined position range, and drives the movable object fixing table to move to a direction away from the suction separator in the first predetermined position range to separate the flexible panel from the glass substrate of the fixed object fixed on the movable object fixing table and fix the flexible panel on the adhesive element, and wherein the suction separator includes a roller with auto rotation, and an outer surface of the roller is covered by a layer of the adhesive element.

In one embodiment, the apparatus of separating a flexible panel from a glass substrate further includes a movable object stripping table, the movable object stripping table connected to a fourth end of the console, driven by the console to move back and forth in a third predetermined position range, and a stripping element disposed on the movable object stripping table, and wherein the console drives the movable object stripping table to move to a fourth position in the third predetermined position range when the console drives the lifting platform to move to a third position along the direction away from the movable object fixing table in the second predetermined position range, the stripping element tightly attaches the flexible panel adhered to the adhesive element of the suction separator, and the console drives the stripping element to move away from the direction away from the suction separator in the third predetermined position range to separate the flexible panel adhered on the adhesive element and fix the flexible panel on the stripping element, wherein an adhesive force of the stripping element is larger than the certain adhesive force of the adhesive element.

In one embodiment, the adhesive element includes an adhesive film with a certain adhesion.

In one embodiment, the stripping element includes an adhesive glue with a certain adhesion.

In one embodiment, the position catcher includes a charge coupled device image sensor.

Furthermore, according to another aspect, the embodiment of the disclosure provides a method of separating a flexible panel from a glass substrate. The method of separating a flexible panel from a glass substrate includes the following steps: driving a movable object fixing table to move in a first predetermined position range by a console, wherein the flexible panel and the glass substrate after a laser separating are as a fixed object fixed on the movable object fixing table; driving a lifting platform to move to a second position in the second predetermined position range and an adhesive element of a suction separator tightly attaches to the flexible panel of the fixed object fixed on the movable object fixing table by the console after a position catcher captured the fixed object on the movable object fixing table moved to a first position in the first predetermined position range; driving the lifting platform to move to a direction away from the movable object fixing table in the second predetermined position range, and driving the movable object fixing table to move to a direction away from the suction separator in the first predetermined position range to separate the flexible panel from the glass substrate of the fixed object fixed on the movable object fixing table and fix the flexible panel on the adhesive element, and wherein a certain adhesive force of the adhesive element is larger than an adhesive force between the flexible panel and the glass substrate as the fixed object fixed on the movable object fixing table.

In one embodiment, the method of separating a flexible panel from a glass substrate further includes: driving a movable object stripping table to move to a fourth position in a third predetermined position range by the console when the console drives the lifting platform to move to a third position along the direction away from the movable object fixing table in the second predetermined position range, a stripping element of the movable object stripping table tightly attaches the flexible panel adhered to the adhesive element of the suction separator, and driving the stripping element to move away from the direction away from the suction separator in the third predetermined position range to separate the flexible panel adhered on the adhesive element and fix the flexible panel on the stripping element, wherein an adhesive force of the stripping element is larger than the certain adhesive force of the adhesive element.

In one embodiment, the adhesive element includes an adhesive film with a certain adhesion.

In one embodiment, the stripping element includes an adhesive glue with a certain adhesion.

By applying the technical solution according to the embodiment of the disclosure, the console drives the movable object fixing table and the suction separator to move to each other, and the suction separator could tightly attach the flexible panel of the fixed object fixed on the movable object fixing table. Then, the console drives the movable object fixing table and the suction separator to move to opposite to each other in order to separate the flexible panel from the glass substrate of the fixed object fixed on the movable object fixing table and fix the flexible panel on the adhesive element of the suction separator by the certain adhesive force of the adhesive element is larger than the adhesive force between the flexible panel and the glass substrate as the fixed object fixed on the movable object fixing table. Therefore, the flexible panel could be completely separated from the glass substrate, and the flexible panel and the glass substrate will not be damaged.

By applying the technical solution according to the embodiment of the disclosure, the console further drives the movable object stripping table to move in order to separate the flexible panel adhered on the adhesive element of the suction separator. Therefore, the efficiency of separating the flexible panel from the glass substrate of the fixed object fixed on the movable object fixing table could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures:

FIG. 9 is a flow chart diagram of a method of separating flexible panel from glass substrate according to an embodiment of the disclosure.

DETAILED DESCRIPTION OF PREFERRED EMBODIMENTS

Figure 1:
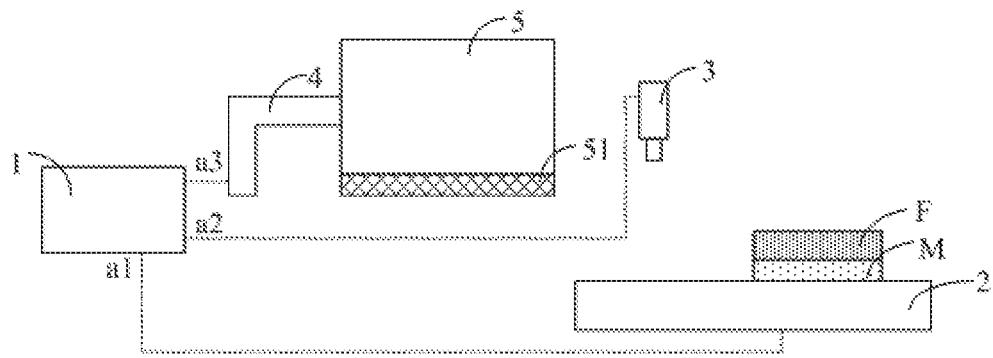
FIG. 1 is a structural schematic view of an apparatus of separating flexible panel from glass substrate according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Referring to FIG. 1 to FIG. 7, the embodiment of the disclosure provides an apparatus of separating flexible panel from glass substrate. The apparatus of separating flexible panel from glass substrate includes a console 1, a movable object fixing table 2, a position catcher 3, a lifting platform 4, and a suction separator 5.

The movable object fixing table 2 is connected to a first end a1 of the console 1 and driven by the console 1 in order to move back and forth in a first predetermined position range. A fixing position is disposed on the movable object fixing table 2. The flexible panel F and the glass substrate M after a laser separating are as a fixed object fixed on the fixing position and move back and forth in the first predetermined position range, wherein a bottom of the glass substrate M is fixed on the fixing position and the flexible panel F is disposed on a top of the glass substrate.

The position catcher 3 is connected to a second end a2 of the console 1 to capture a real-time position of the fixed object fixed on the movable object fixing table 2. In one embodiment, the position catcher 3 includes a charge coupled device (CCD) image sensor.

The lifting platform 4 is connected to a third end a3 of the console 1 and driven by the console 1 to move back and forth in a second predetermined position range. The suction separator 5 is disposed on the lifting platform 4, and the lifting platform 4 carries the suction separator 5 to move back and forth in the second predetermined position range.

The suction separator 5 has an adhesive element 51 with a certain adhesive force. The adhesive element 51 is disposed on the suction separator 5 and used for separating the flexible panel F and the glass substrate M as the fixed object fixed on the movable object fixing table 2, wherein the certain adhesive force is larger than an adhesive force between the flexible panel F and the glass substrate M as the fixed object fixed on the movable object fixing table 2.

Figure 2:
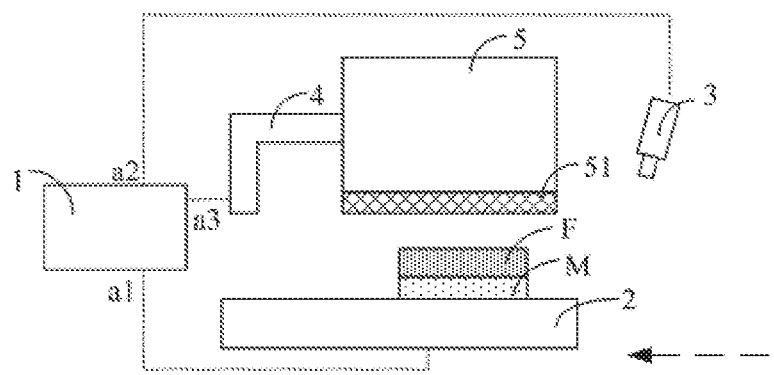
FIG. 2 is a structural schematic view of the movable object fixing table of the apparatus of separating flexible panel from glass substrate according to an embodiment of the disclosure.
Figure 3:
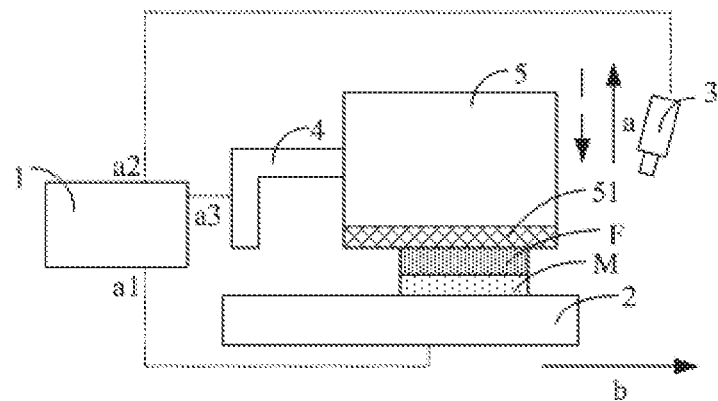
FIG. 3 is a structural schematic view of the lifting platform moving to a second position of the apparatus of separating flexible panel from glass substrate according to an embodiment of the disclosure.
Figure 4:
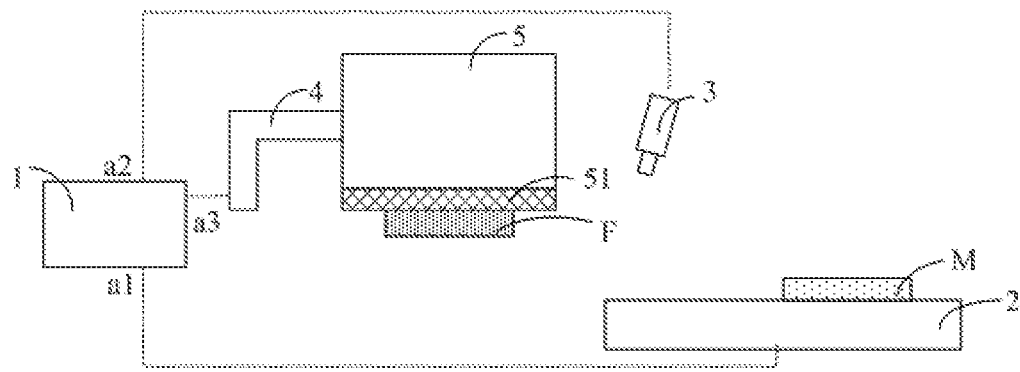
FIG. 4 is a structural schematic view of the flexible panel after separating from the glass substrate of the apparatus of separating flexible panel from glass substrate according to an embodiment of the disclosure.

The console 1 drives the movable object fixing table 2 to move to a first position in the first predetermined position range according to the real-time position of the fixed object fixed on the movable object fixing table 2 captured by the position catcher 3 (as FIG. 2 shown). Then, the console 1 drives the lifting platform 4 to move to a second position in the second predetermined position range (as FIG. 3 shown)

and the adhesive element 51 of the suction separator 5 tightly attaches to the flexible panel F of the fixed object fixed on the movable object fixing table 2. Then, the console 1 drives the lifting platform 4 to move to a direction away from the movable object fixing table 2 in the second predetermined position range (as the solid line arrow symbol a in FIG. 3 shown), and drives the movable object fixing table 2 to move to a direction away from the suction separator 5 in the first predetermined position range (as the solid line arrow symbol b in FIG. 3 shown) in order to separate the flexible panel F from the glass substrate M of the fixed object fixed on the movable object fixing table 2 and fix the flexible panel F on the adhesive element 51 (as FIG. 4 shown).

It should be noted that each of the movable object fixing table 2, the position catcher 3, and the lifting platform 4 connected to the console 1 have a corresponding motor driving device, so the movable object fixing table 2, the position catcher 3, and the lifting platform 4 could be driven to move by the console 1.

Figure 5:
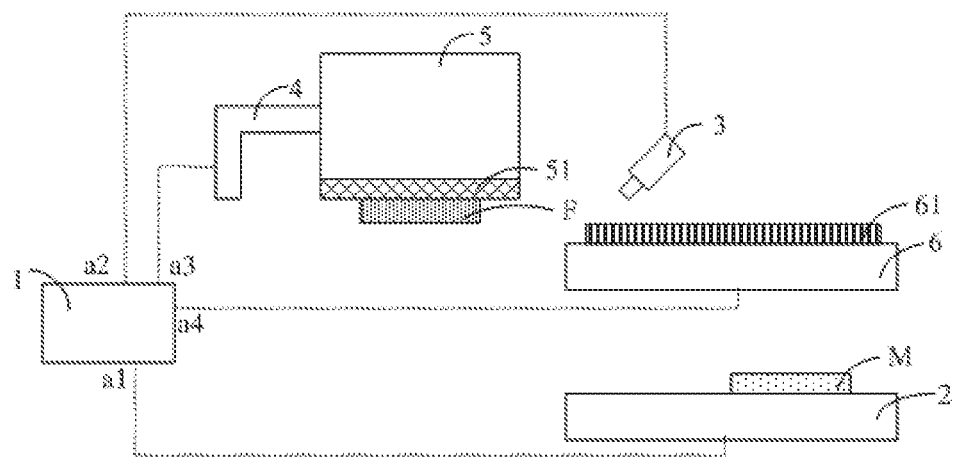
FIG. 5 is a structural schematic view of the lifting platform moving to a third position of the apparatus of separating flexible panel from glass substrate according to an embodiment of the disclosure.
Figure 6:
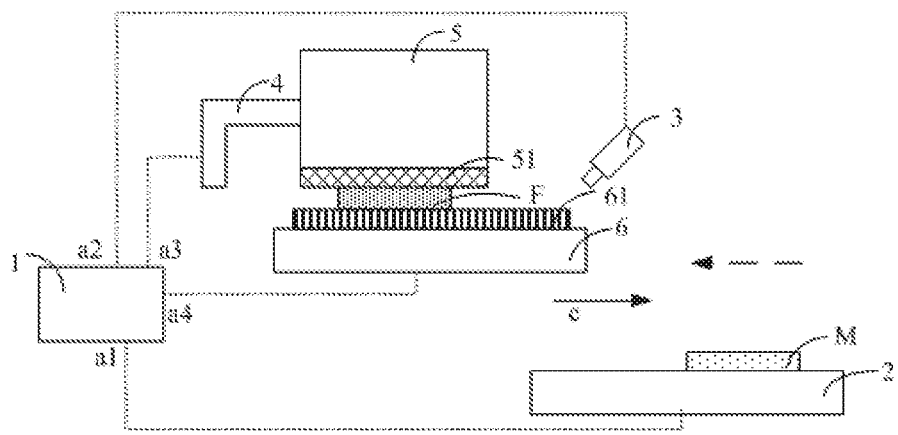
FIG. 6 is a structural schematic view of the movable object stripping table moving to a fourth position of the apparatus of separating flexible panel from glass substrate according to an embodiment of the disclosure.
Figure 7:
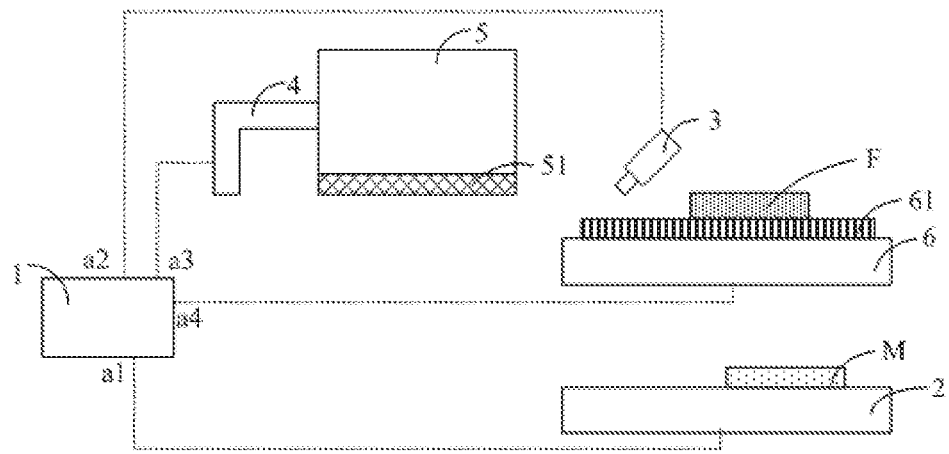
FIG. 7 is a structural schematic view of the flexible panel after stripping from the suction separator of the apparatus of separating flexible panel from glass substrate according to an embodiment of the disclosure.

In the embodiment of the disclosure, to separate the flexible panel F adhered on the adhesive element 51 of the suction separator 5 in order to improve the efficiency of separating the flexible panel F from the glass substrate M of the fixed object fixed on the movable object fixing table 2, the apparatus of separating flexible panel from glass substrate further includes a movable object stripping table 6. The movable object stripping table 6 is connected to a fourth end a4 of the console 1 and driven by the console 1 to move back and forth in a third predetermined position range, and a stripping element 61 is disposed on the movable object stripping table 6. Wherein the console 1 drives the movable object stripping table 6 to move to a fourth position in the third predetermined position range (as FIG. 6 shown) when the console 1 drives the lifting platform 4 to move to a third position along the direction away from the movable object fixing table 2 in the second predetermined position range (as FIG. 5 shown). The stripping element 61 tightly attaches the flexible panel F adhered to the adhesive element 51 of the suction separator 5, and the console 1 drives the stripping element 61 to move away from the direction away from the suction separator 5 in the third predetermined position range (as the solid line arrow symbol c in FIG. 6 shown) to separate the flexible panel F adhered on the adhesive element 51 and fix the flexible panel F on the stripping element 51 (as FIG. 7 shown). Wherein an adhesive force of the stripping element 61 is larger than the certain adhesive force of the adhesive element 51. In one embodiment, the stripping element 61 includes an adhesive glue with a certain adhesion, the adhesive element 51 includes an adhesive film with a certain adhesion, and the adhesive force of the stripping element 61 is larger than the certain adhesive force of the adhesive element 51.

It should be noted that the order of priority of the lifting platform 4 driven to move to a third position along the direction away from the movable object fixing table 2 in the second predetermined position range and the movable object stripping table 6 driven to move to a fourth position in the third predetermined position range could be set up according to the situation. Meanwhile, the movable object stripping table 6 has a corresponding motor driving device, so the movable object stripping table 6 could be driven to move by the console 1.

In the embodiment of the disclosure, in order to reduce the damage of the flex panel F separating from the glass substrate M and improve the efficiency of separating, the suction separator 5 may include a roller with auto rotation, and an outer surface of the roller is covered by a layer of the adhesive element.

Figure 8:
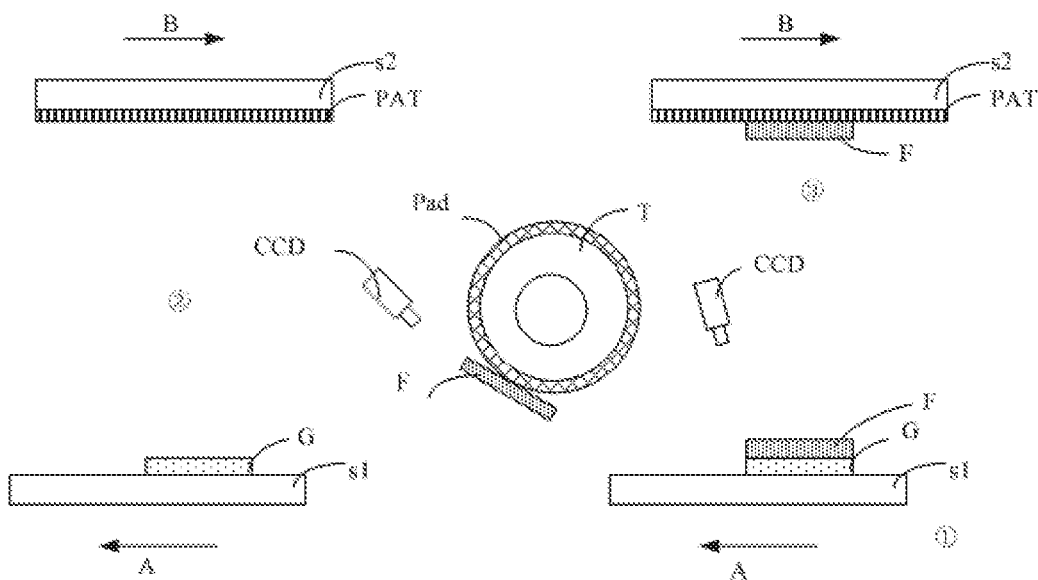
FIG. 8 is an application scene diagram of the apparatus of separating flexible panel from glass substrate according to an embodiment of the disclosure.

As FIG. 8 shown, an application scene diagram of the apparatus of separating flexible panel from glass substrate according to an embodiment of the disclosure is further described.

In FIG. 8, s1 is the movable object fixing table, s2 is the movable object stripping table, the roller T is the suction separator and to move by the console controlling the lifting platform, and the outer surface of the roller T adhered the adhesive element Pad. F is the flexible panel, G is the glass substrate, CCD is the position catcher, PAT is the stripping element. Arrow symbol A and arrow symbol B are respectively the moving direction of s1 and s2.

First, put the flexible panel F and the glass substrate G on the movable object fixing table s1 after laser separating, capture the position data by the position catcher CCD aligning to X-Y axis and feed the position data back to the console. Then the console controls the movable object fixing table s1 to move along the direction of the arrow symbol A (i.e. the left direction).

Second, the console receives the position data captured by the position catcher CCD in real time, controls the movable object fixing table S1 to move to right down (i.e. the first position), and controls the roller T to move down along Z axis and adhere the flexible panel F (i.e. the second position). Wherein the adhesive force of the adhesive element Pad is larger than the adhesive force between the flexible panel F and the glass substrate G, at this time, the roller T could automatically rotates, so the flexible panel F could be separated quickly.

Third, the console controls the movable object stripping table s2 to move along the direction of the arrow symbol B (i.e. the right direction) till to the right up of the after the roller T (i.e. the fourth position) receiving the CCD data of the roller T. Then the roller T moves up along Z axis (i.e. the third position) to adhere the movable object stripping table s2, the movable object stripping table s2 continues moving and the roller T moves at the same time to keep a relatively stationary state in order to separate the flexible panel F to the stripping element PAT of the movable object stripping table s2.

As FIG. 9 shown, a method of separating flexible panel from glass substrate according to an embodiment of the disclosure could be applied on the above-mentioned apparatus of separating flexible panel from glass substrate. The method includes the following steps:

Step S1: driving a movable object fixing table to move in a first predetermined position range by a console, wherein the flexible panel and the glass substrate after a laser separating are as a fixed object fixed on the movable object fixing table.

Step S2: driving a lifting platform to move to a second position in the second predetermined position range and an adhesive element of a suction separator tightly attaches to the flexible panel of the fixed object fixed on the movable object fixing table by the console after a position catcher captured the fixed object on the movable object fixing table moved to a first position in the first predetermined position range.

Step S3: driving the lifting platform to move to a direction away from the movable object fixing table in the second predetermined position range, and driving the movable object fixing table to move to a direction away from the suction separator in the first predetermined position range to separate the flexible panel from the glass substrate of the fixed object fixed on the movable object fixing table and fix the flexible panel on the adhesive element, and wherein a certain adhesive force of the adhesive element is larger than an adhesive force between the flexible panel and the glass substrate as the fixed object fixed on the movable object fixing table.

Wherein, the method further includes: driving a movable object stripping table to move to a fourth position in a third predetermined position range by the console when the console drives the lifting platform to move to a third position along the direction away from the movable object fixing table in the second predetermined position range, a stripping element of the movable object stripping table tightly attaches the flexible panel adhered to the adhesive element of the suction separator, and driving the stripping element to move away from the direction away from the suction separator in the third predetermined position range to separate the flexible panel adhered on the adhesive element and fix the flexible panel on the stripping element, wherein an adhesive force of the stripping element is larger than the certain adhesive force of the adhesive element.

Wherein, the adhesive element includes an adhesive film with a certain adhesion.

Wherein, the stripping element includes an adhesive glue with a certain adhesion.

In summary, by applying the technical solution according to the embodiment of the disclosure, the console drives the movable object fixing table and the suction separator to move to each other, and the suction separator could tightly attach the flexible panel of the fixed object fixed on the movable object fixing table. Then, the console drives the movable object fixing table and the suction separator to move to opposite to each other in order to separate the flexible panel from the glass substrate of the fixed object fixed on the movable object fixing table and fix the flexible panel on the adhesive element of the suction separator by the certain adhesive force of the adhesive element is larger than the adhesive force between the flexible panel and the glass substrate as the fixed object fixed on the movable object fixing table. Therefore, the flexible panel could be completely separated from the glass substrate, and the flexible panel and the glass substrate will not be damaged.

by applying the technical solution according to the embodiment of the disclosure, the console further drives the movable object stripping table to move in order to separate the flexible panel adhered on the adhesive element of the suction separator. Therefore, the efficiency of separating the flexible panel from the glass substrate of the fixed object fixed on the movable object fixing table could be improved.

A person having ordinary skill in the art can understand that all or a part of steps in the above embodiment methods can be implemented by controlling related hardware through programs. The programs can be stored in a computer readable storage medium, which may be a ROM/RAM, a disk, a disc etc.

The foregoing contents are detailed description of the disclosure in conjunction with specific preferred embodiments and concrete embodiments of the disclosure are not limited to this description. For the person skilled in the art of the disclosure, without departing from the concept of the disclosure, simple deductions or substitutions can be made and should be included in the protection scope of the application.

What is claimed is:

1. An apparatus of separating a flexible panel from a glass substrate, comprising:
    a console;
    a movable object fixing table;
    a position catcher;
    a lifting platform;
    a suction separator;
    a movable object stripping table;
    wherein the movable object fixing table is connected to a first end of the console, driven by the console to move back and forth in a first predetermined position range along a first direction, a fixing position is disposed on the movable object fixing table, the flexible panel and the glass substrate after a laser separating are used as a fixed object fixed on the fixing position and move back and forth in the first predetermined position range along the first direction, and wherein a bottom of the glass substrate is fixed on the fixing position and the flexible panel is disposed on a top of the glass substrate in a thickness-wise direction of the glass substrate intersecting the first direction;
    wherein the position catcher is connected to a second end of the console to capture a real-time position of the fixed object fixed on the movable object fixing table;
    wherein the lifting platform is connected to a third end of the console, driven by the console to move back and forth in a second predetermined position range along a second direction same as the thickness-wise direction of the glass substrate, the suction separator is disposed on the lifting platform, and the lifting platform carries the suction separator to move back and forth in the second predetermined position range along the second direction;
    wherein an adhesive element with a certain adhesive force is disposed on the suction separator to separate the flexible panel and the glass substrate which are used as the fixed object fixed on the movable object fixing table, and the certain adhesive force for the flexible panel is larger than an adhesive force between the flexible panel and the glass substrate which are used as the fixed object fixed on the movable object fixing table;
    wherein the movable object stripping table is connected to a fourth end of the console, driven by the console to move back and forth in a third predetermined position range along a third direction intersecting the thickness-wise direction of the glass substrate, and a stripping element disposed on the movable object stripping table;
    wherein the console drives the movable object fixing table to move to a first position in the first predetermined position range along the first direction according to the real-time position of the fixed object fixed on the movable object fixing table captured by the position catcher, drives the lifting platform to move to a second position in the second predetermined position range along the second direction and the adhesive element tightly attaches to the flexible panel of the fixed object fixed on the movable object fixing table, drives the lifting platform to move away from the movable object fixing table in the second predetermined position range along the second direction, and drives the movable object fixing table to move away from the suction separator in the first predetermined position range along the first direction to separate the flexible panel from the glass substrate of the fixed object fixed on the movable object fixing table and fix the flexible panel on the adhesive element;
    wherein the console drives the movable object stripping table to move to a fourth position in the third predetermined position range along the third direction when the console drives the lifting platform to move to a third position in the second predetermined position range along the second direction, the stripping element tightly attaches the flexible panel adhered to the adhesive element of the suction separator, and the console drives the movable object stripping table to move away from the suction separator in the third predetermined position range along the third direction to separate the flexible panel adhered on the adhesive element and fix the flexible panel on the stripping element, wherein an adhesive force of the stripping element for the flexible panel is larger than the certain adhesive force of the adhesive element;

wherein the second position is located between the movable object fixing table and the third position, in the thickness-wise direction of the glass substrate.

2. The apparatus of separating a flexible panel from a glass substrate according to claim 1, wherein the suction separator comprises a roller with auto rotation, and an outer surface of the roller is covered by a layer of the adhesive element.

3. The apparatus of separating a flexible panel from a glass substrate according to claim 2, wherein the adhesive element comprises an adhesive film with a certain adhesion.

4. The apparatus of separating a flexible panel from a glass substrate according to claim 3, wherein the stripping element comprises an adhesive glue with a certain adhesion.

5. The apparatus of separating a flexible panel from a glass substrate according to claim 4, wherein the position catcher comprises a charge coupled device image sensor.

6. An apparatus of separating a flexible panel from a glass substrate, comprising:
   a console;
   a movable object fixing table;
   a position catcher;
   a lifting platform;
   a suction separator; and
   a movable object stripping table;
   wherein the movable object fixing table is connected to a first end of the console, driven by the console to move back and forth in a first predetermined position range along a first direction, a fixing position is disposed on the movable object fixing table, the flexible panel and the glass substrate after a laser separating are used as a fixed object fixed on the fixing position and move back and forth in the first predetermined position range along the first direction, and wherein a bottom of the glass substrate is fixed on the fixing position and the flexible panel is disposed on a top of the glass substrate in a thickness-wise direction of the glass substrate intersecting the first direction;
   wherein the position catcher is connected to a second end of the console to capture a real-time position of the fixed object fixed on the movable object fixing table;
   wherein the lifting platform is connected to a third end of the console, driven by the console to move back and forth in a second predetermined position range along a second direction same as the thickness-wise direction of the glass substrate, the suction separator is disposed on the lifting platform, and the lifting platform carries the suction separator to move back and forth in the second predetermined position range along the second direction;
   wherein an adhesive element with a certain adhesive force is disposed on the suction separator to separate the flexible panel and the glass substrate which are used as the fixed object fixed on the movable object fixing table, and the certain adhesive force for the flexible panel is larger than an adhesive force between the flexible panel and the glass substrate which are used as the fixed object fixed on the movable object fixing table;
   wherein the movable object stripping table connected to a fourth end of the console, driven by the console to move back and forth in a third predetermined position range along a third direction intersecting the thickness-wise direction of the glass substrate, and a stripping element disposed on the movable object stripping table;
   wherein the console drives the movable object fixing table to move to a first position in the first predetermined position range along the first direction according to the real-time position of the fixed object fixed on the movable object fixing table captured by the position catcher, drives the lifting platform to move to a second position in the second predetermined position range along the second direction and the adhesive element tightly attaches to the flexible panel of the fixed object fixed on the movable object fixing table, drives the lifting platform to move away from the movable object fixing table in the second predetermined position range along the second direction, and drives the movable object fixing table to move away from the suction separator in the first predetermined position range along the first direction to separate the flexible panel from the glass substrate of the fixed object fixed on the movable object fixing table and fix the flexible panel on the adhesive element;
   wherein the console drives the movable object stripping table to move to a fourth position in the third predetermined position range along the third direction when the console drives the lifting platform to move to a third position in the second predetermined position range along the second direction, the stripping element tightly attaches the flexible panel adhered to the adhesive element of the suction separator, and the console drives the movable object stripping table to move away from the suction separator in the third predetermined position range along the third direction to separate the flexible panel adhered on the adhesive element and fix the flexible panel on the stripping element, wherein an adhesive force of the stripping element for the flexible panel is larger than the certain adhesive force of the adhesive element;
   wherein the second direction the second position is located between the movable object fixing table and the third position, in the thickness-wise direction of the glass substrate;
   wherein the suction separator comprises a roller with auto rotation, and an outer surface of the roller is covered by a layer of the adhesive element;
   wherein the movable object fixing table and the movable object stripping table are located opposite sides of the roller in the second direction, and thereby the roller is movable upwardly and downwardly between the movable object fixing table and the movable object stripping table in the second direction.

7. The apparatus of separating a flexible panel from a glass substrate according to claim 6, wherein the adhesive element comprises an adhesive film with a certain adhesion.

8. The apparatus of separating a flexible panel from a glass substrate according to claim 7, wherein the stripping element comprises an adhesive glue with a certain adhesion.

9. The apparatus of separating a flexible panel from a glass substrate according to claim 8, wherein the position catcher comprises a charge coupled device image sensor.

10. A method of separating a flexible panel from a glass substrate, comprising the following steps:
- driving a movable object fixing table to move in a first predetermined position range along a first direction by a console, wherein the flexible panel and the glass substrate after a laser separating are used as a fixed object fixed on the movable object fixing table, and the flexible panel is arranged on the glass substrate in a thickness-wise direction of the glass substrate intersecting the first direction;
- driving a lifting platform to move to a second position in the second predetermined position range along a second direction same as the thickness-wise direction of the glass substrate and an adhesive element of a suction separator tightly attaches to the flexible panel of the fixed object fixed on the movable object fixing table by the console after a position catcher captured the fixed object on the movable object fixing table moved to a first position in the first predetermined position range;
- driving the lifting platform to move away from the movable object fixing table in the second predetermined position range along the second direction, and driving the movable object fixing table to move away from the suction separator in the first predetermined position range along the first direction to separate the flexible panel from the glass substrate of the fixed object fixed on the movable object fixing table and fix the flexible panel on the adhesive element;
- driving a movable object stripping table to move to a fourth position in a third predetermined position range along a third direction intersecting the thickness-wise direction of the glass substrate by the console when the console drives the lifting platform to move to a third position in the second predetermined position range along the second direction, a stripping element of the movable object stripping table tightly attaches the flexible panel adhered to the adhesive element of the suction separator, and driving the movable object stripping table to move away from the suction separator in the third predetermined position range along the third direction to separate the flexible panel adhered on the adhesive element and fix the flexible panel on the stripping element;
- wherein a certain adhesive force of the adhesive element for the flexible panel is larger than an adhesive force between the flexible panel and the glass substrate which are used as the fixed object fixed on the movable object fixing table, and an adhesive force of the stripping element for the flexible panel is larger than the certain adhesive force of the adhesive element;
- wherein the second position is located between the movable object fixing table and the third position, in the thickness-wise direction of the glass substrate.

11. The method of separating a flexible panel from a glass substrate according to claim 10, wherein the adhesive element comprises an adhesive film with a certain adhesion.

12. The method of separating a flexible panel from a glass substrate according to claim 11, wherein the stripping element comprises an adhesive glue with a certain adhesion.

13. The method of separating a flexible panel from a glass substrate according to claim 10, wherein the suction separator comprises a roller with auto rotation, and an outer surface of the roller is covered by a layer of the adhesive element; the method comprises:
- controlling the roller to move downwardly along the second direction to the second position;
- controlling the roller to move upwardly along the second direction to the third direction.

\* \* \* \* \*